(12) United States Patent
Kim et al.

(10) Patent No.: US 10,164,212 B2
(45) Date of Patent: Dec. 25, 2018

(54) ORGANIC LIGHT EMITTING DIODE DISPLAY

(71) Applicant: SAMSUNG DISPLAY CO., LTD., Yongin-si, Gyeonggi-do (KR)

(72) Inventors: Dong Chan Kim, Gunpo-si (KR); Won Jong Kim, Suwon-si (KR); Eung Do Kim, Seoul (KR); Ji Hye Lee, Incheon (KR); Da Hea Im, Incheon (KR); Sang Hoon Yim, Suwon-si (KR); Yoon Hyeung Cho, Yongin-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 14/985,285

(22) Filed: Dec. 30, 2015

(65) Prior Publication Data
US 2016/0329521 A1 Nov. 10, 2016

(30) Foreign Application Priority Data
May 6, 2015 (KR) .......................... 10-2015-0063363

(51) Int. Cl.
*H01L 51/52* (2006.01)
*H01L 27/32* (2006.01)

(52) U.S. Cl.
CPC ...... *H01L 51/5253* (2013.01); *H01L 27/3244* (2013.01); *H01L 51/5275* (2013.01)

(58) Field of Classification Search
CPC ............. H01L 27/3211; H01L 51/0061; H01L 51/5246; H01L 51/5253; H01L 51/5275
See application file for complete search history.

(56) References Cited

U.S. PATENT DOCUMENTS

| 5,677,572 | A | 10/1997 | Hung et al. |
| 7,875,895 | B2 | 1/2011 | Kwack et al. |
| 8,212,269 | B2* | 7/2012 | Karg .................. H01L 51/5262 257/98 |
| 9,368,757 | B2 | 6/2016 | Choi et al. |
| 2006/0250084 | A1* | 11/2006 | Cok .................... H01L 51/5234 313/512 |
| 2008/0278067 | A1 | 11/2008 | Tyan et al. |
| 2011/0121271 | A1 | 5/2011 | Jeon et al. |
| 2011/0163330 | A1* | 7/2011 | Kim .................... H01L 51/5256 257/88 |
| 2011/0309739 | A1* | 12/2011 | Song .................. H01L 51/5088 313/504 |
| 2011/0315314 | A1* | 12/2011 | Lee ....................... B32B 38/162 156/281 |
| 2014/0138636 | A1 | 5/2014 | Song |
| 2014/0159023 | A1* | 6/2014 | Matsumoto ......... H01L 51/0061 257/40 |
| 2014/0284566 | A1* | 9/2014 | Yoo ..................... H01L 51/5012 257/40 |
| 2016/0329521 | A1 | 11/2016 | Kim et al. |
| 2016/0380235 | A1* | 12/2016 | Kim .................... H01L 51/5262 257/40 |

FOREIGN PATENT DOCUMENTS

| JP | 2009-044104 A | 2/2009 |
| KR | 10-2011-0058126 A | 6/2011 |
| KR | 10-2014-0038656 A | 3/2014 |
| KR | 10-2014-0064349 A | 5/2014 |
| WO | WO 2012/157211 | * 11/2012 |

OTHER PUBLICATIONS

Magnesium Fluoride (MgF2), Janos Technology, 2017.*
Machine translation of KR 10-2011-0058126, published on Jun. 1, 2011.*
U.S. Office Action dated May 21, 2018, issued in U.S. Appl. No. 15/087,808 (10 pages).

* cited by examiner

*Primary Examiner* — Anca Eoff
(74) *Attorney, Agent, or Firm* — Lewis Roca Rothgerber Christie LLP

(57) ABSTRACT

An organic light emitting diode display includes: a substrate; an organic light emitting element on the substrate; and a capping layer on the organic light emitting element and including a high refraction layer formed of an inorganic material having a refractive index which is equal to or greater than about 1.7 and equal to or less than about 6.0, wherein the inorganic material includes at least one selected from CuI, thallium iodide (TlI), AgI, $CdI_2$, $HgI_2$, $SnI_2$, $PbI_2$, $BiI_3$, $ZnI_2$, $MnI_2$, $FeI_2$, $CoI_2$, $NiI_2$, aluminum iodide ($AlI_3$), thorium (IV) iodide ($ThI_4$), uranium triiodide ($UI_3$), MgS, MgSe, MgTe, CaS, CaSe, CaTe, SrS, SrSe, SrTe, BaS, BaSe, BaTe, SnS, PbS, CdS, CaS, ZnS, ZnTe, PbTe, CdTe, SnSe, PbSe, CdSe, CuO, $Cu_2O$, $WO_3$, $MoO_3$, $SnO_2$, $Nb_2O_5$, $Ag_2O$, CdO, CoO, $Pr_2O_3$, $Bi_2O_3$, $Fe_2O_3$, AlAs, GaAs, InAs, GaP, InP, AlP, AlSb, GaSb, and InSb.

12 Claims, 6 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0063363 filed in the Korean Intellectual Property Office on May 6, 2015, the entire contents of which are incorporated herein by reference.

BACKGROUND

1. Field

Embodiments of the present disclosure relate to an organic light emitting diode display.

2. Description of the Related Art

The recent trend toward lightweight and thin personal computers and television sets necessitates lightweight and thin display devices. Flat panel displays (e.g., a liquid crystal display (LCD)) satisfying such requirements are being substituted for conventional cathode ray tubes (CRTs). However, since an LCD is a passive display device, an additional backlight is used as a light source, and LCDs have various problems, such as a slow response time and a narrow viewing angle.

In this regard, an organic light emitting diode (OLED) display has recently been highlighted as a self-emission display device having features of a wide viewing angle, outstanding contrast, and a fast response time.

The OLED display includes organic light emitting diodes for emitting light, and in the organic light emitting diodes, electrons injected from one electrode and holes injected from another electrode are combined with each other in a light emitting layer, thereby generating excitons, and energy is outputted from the excitons to emit light.

Various suitable methods that can improve light efficiency by effectively extracting light that is generated in the organic light emitting layer are necessitated.

The above information disclosed in this Background section is only to enhance the understanding of the background of the present disclosure and therefore it may contain information that does not form the prior art that is already known in this country to a person of ordinary skill in the art.

SUMMARY

Embodiments of the present disclosure have been made in an effort to provide an organic light emitting diode display in which light efficiency is improved.

An exemplary embodiment of the present disclosure provides an organic light emitting diode display including: a substrate; an organic light emitting element disposed on the substrate; and a capping layer disposed on the organic light emitting element and including a high refraction layer formed of an inorganic material with a refractive index which is equal to or greater than about 1.7 and equal to or less than about 6.0, wherein the inorganic material may include at least one selected from CuI, thallium iodide (TlI), AgI, $CdI_2$, $HgI_2$, $SnI_2$, $PbI_2$, $BiI_3$, $ZnI_2$, $MnI_2$, $FeI_2$, $CoI_2$, $NiI_2$, aluminium iodide ($AlI_3$), thorium (IV) iodide ($ThI_4$), uranium triiodide ($UI_3$), MgS, MgSe, MgTe, CaS, CaSe, CaTe, SrS, SrSe, SrTe, BaS, BaSe, BaTe, SnS, PbS, CdS, CaS, ZnS, ZnTe, PbTe, CdTe, SnSe, PbSe, CdSe, CuO, $Cu_2O$, $WO_3$, $MoO_3$, $SnO_2$, $Nb_2O_5$, $Ag_2O$, CdO, CoO, $Pr_2O_3$, $Bi_2O_3$, $Fe_2O_3$, AlAs, GaAs, InAs, GaP, InP, AlP, AlSb, GaSb, and InSb.

The capping layer may include a low refraction layer formed of an inorganic material with a refractive index which is equal to or greater than about 1.0 and equal to or less than about 1.7.

The low refraction layer may be disposed between the high refraction layer and the organic light emitting element.

The low refraction layer may include an inorganic material including a halogen compound.

The low refraction layer may include at least one selected from $MgF_2$, LiF, $AlF_3$, NaF, KF, RbF, $CaF_2$, $SrF_2$, and $YbF_2$.

A refraction layer including the low refraction layer and the high refraction layer may be formed in plural.

The organic light emitting diode display may further include an encapsulation substrate assembled on and sealing the substrate in order to cover the organic light emitting element.

The encapsulation substrate and the organic light emitting element may be spaced apart from each other.

The organic light emitting element may include a first electrode and a second electrode facing each other, and a light emitting layer disposed between the first electrode and the second electrode, wherein the capping layer is disposed directly on the second electrode.

The first electrode may be formed as a reflective layer.

The light emitting layer may include a red light emitting layer, a green light emitting layer, a blue light emitting layer, and an auxiliary layer disposed below the blue light emitting layer.

The organic light emitting diode display may further include a red resonant auxiliary layer disposed below the red light emitting layer and a green resonant auxiliary layer disposed below the green light emitting layer.

The auxiliary layer may include a compound represented by Chemical Formula 1.

Chemical Formula 1

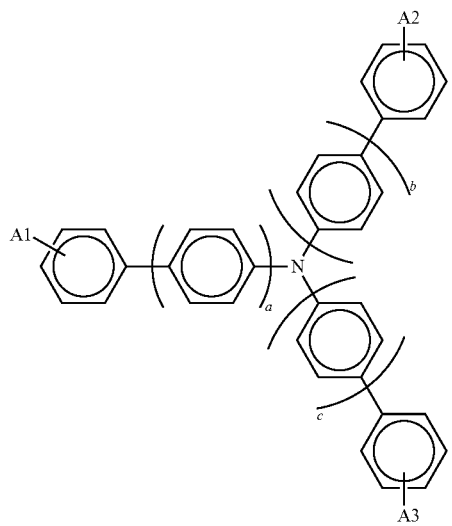

In Chemical Formula 1, A1, A2, and A3 may be an alkyl group, an aryl group, carbazole, dibenzothiophene, dibenzofuran (DBF), and biphenyl, respectively, and a, b, and c may be each independently positive numbers of zero to four, respectively.

The auxiliary layer may include a compound represented by Chemical Formula 2.

Chemical Formula 2

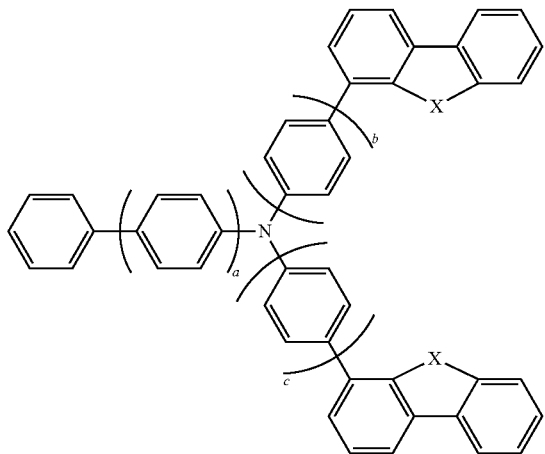

In Chemical Formula 2, a may be 0 to 3, b and c may be 0 to 3, respectively, X may be selected from O, N, or S, and each X may be the same as the other or different.

According to an exemplary embodiment of the present disclosure, it is possible to improve light efficiency of an organic light emitting diode display by forming a capping layer with an inorganic material that has a high refractive index.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
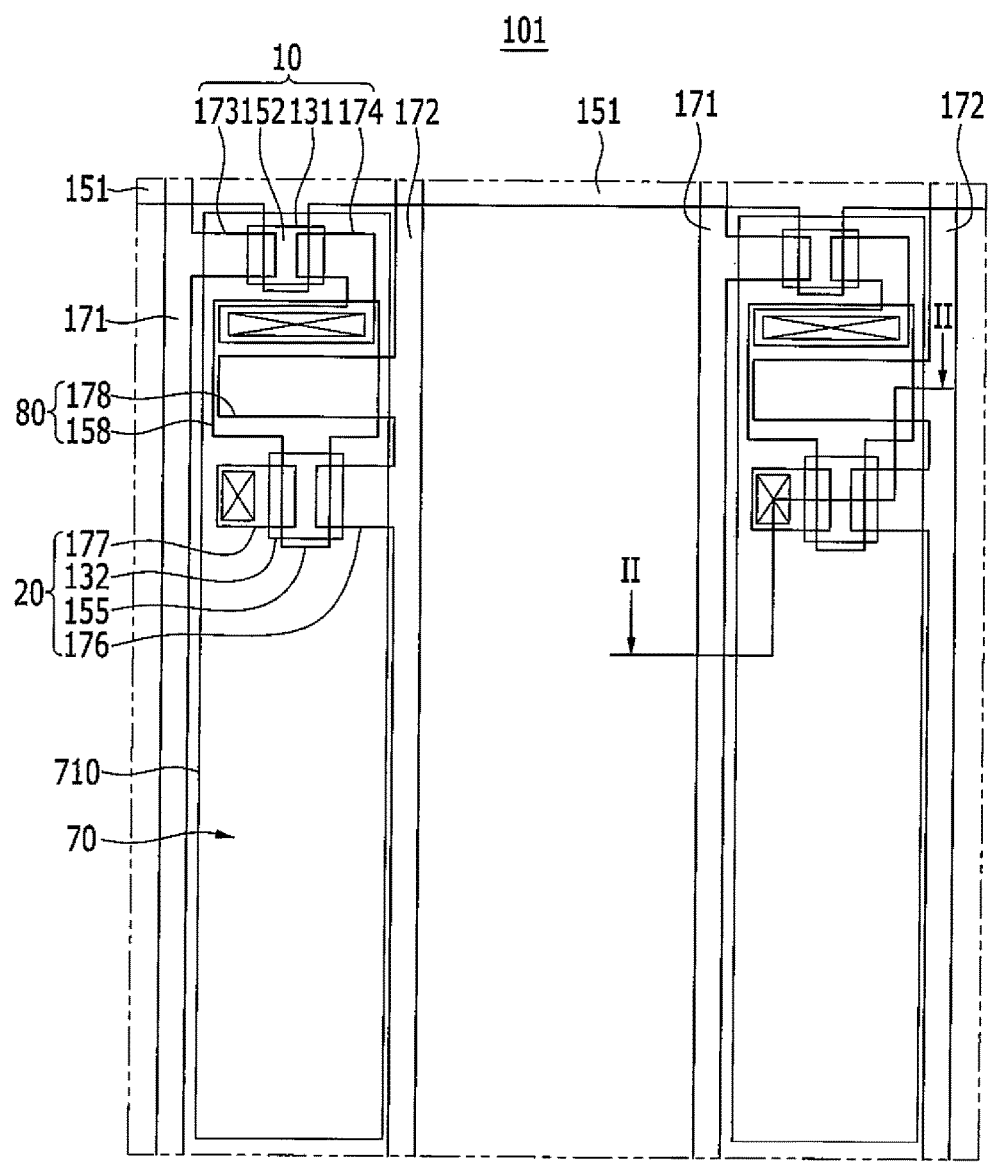
FIG. 1 is a pixel layout view of an organic light emitting diode display according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present invention. On the contrary, exemplary embodiments introduced herein are provided to make the present disclosure thorough and complete and to sufficiently convey the spirit of the present invention to those skilled in the art.

In the drawings, the thickness of layers and regions may be exaggerated for clarity. In addition, when a layer is described to be formed on another layer or on a substrate, this means that the layer may be formed on the other layer or on the substrate (e.g., the layer may be directly on the other layer or substrate), or a third layer may be interposed between the layer and the other layer or the substrate (e.g., the layer may be indirectly on the other layer or substrate). Like reference numerals designate like elements throughout the specification.

Figure 2:
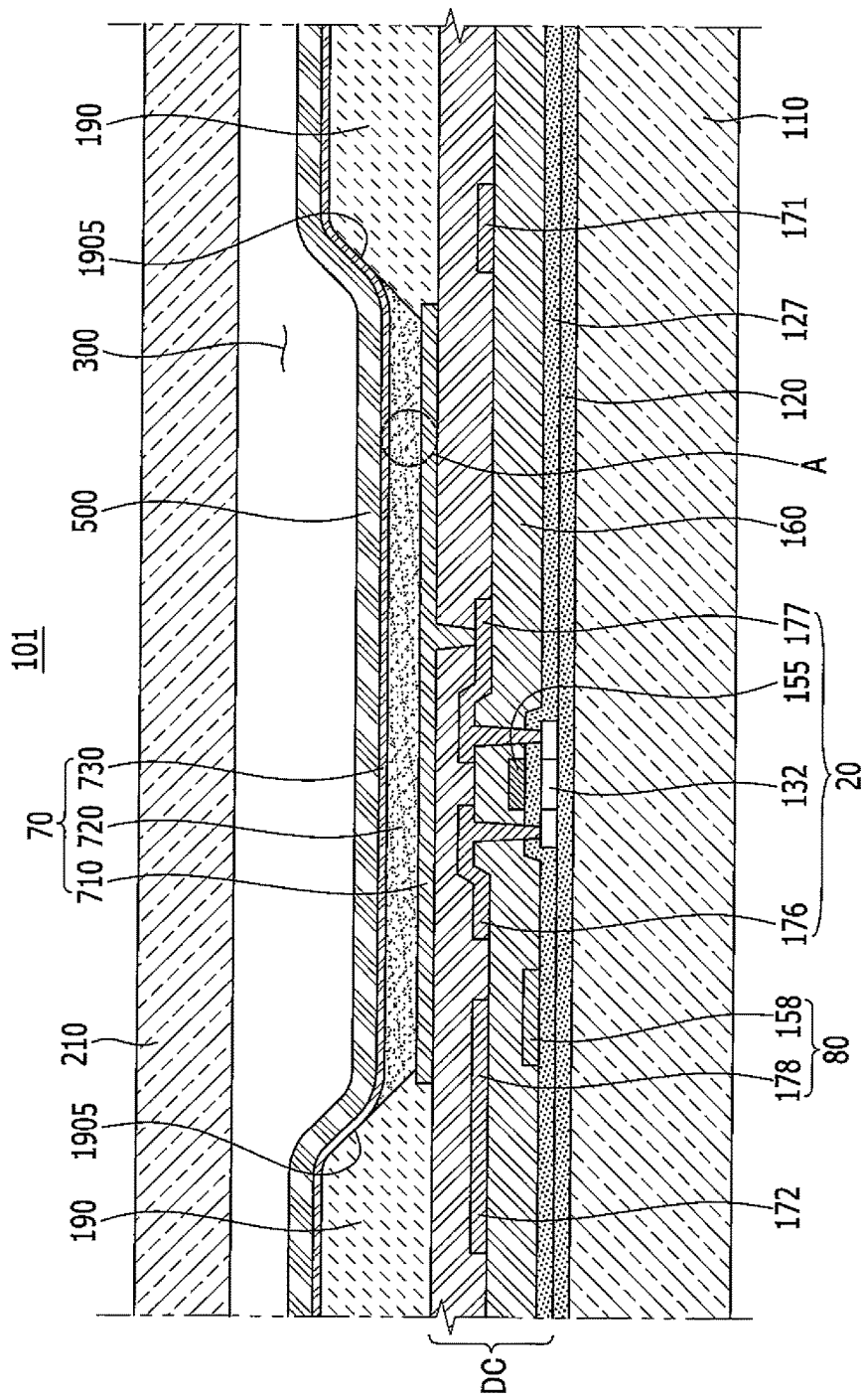
FIG. 2 is a cross-sectional view of FIG. 1 taken along line II-II.

FIG. 1 is a pixel layout view of an organic light emitting diode display according to the exemplary embodiment of the present disclosure. FIG. 2 is a cross-sectional view of FIG. 1 taken along line II-II.

Referring to FIGS. 1 and 2, an organic light emitting diode display 101 according to an exemplary embodiment of the present disclosure includes a substrate 110, a driving circuit DC, an organic light emitting element 70, a capping layer 500, and an encapsulation substrate 210. The organic light emitting diode display 101 may further include a buffer layer 120 and a pixel defining layer 190.

The substrate 110 may be made of an inorganic material such as, for example, glass, an organic (e.g., an organic material) such as, for example, polycarbonate, polymethyl methacrylate, polyethylene terephthalate, polyethylene naphthalate, polyamide, polyimide, polyether sulfone, or combinations or mixtures thereof, a silicon wafer, a metal, or the like.

The buffer layer 120 is disposed on the substrate 110. The buffer layer 120 may be formed as one or more various suitable inorganic and organic films. The buffer layer 120 prevents undesired elements, such as impurities or moisture from penetrating the driving circuit DC or the organic light emitting element 70 (or reduces such penetration of the undesired elements), and concurrently or simultaneously flattens the surface thereof. The buffer layer 120 may be formed of a material that performs such function. For example, the buffer layer 120 may be any one of a silicon nitride (e.g., $SiN_x$; $\frac{1}{2} \leq x \leq 2$, e.g., $x=1.33$) film, a silicon oxide (e.g., $SiO_y$; $1 \leq y \leq 2$, e.g., $y=2$) film, or a silicon oxynitriding (e.g., $SiO_xN_y$; $1 \leq x \leq 2$ and $1 \leq y \leq 2$) film (a silicon oxynitride film). However, the buffer layer 120 is not a necessary component and may not be provided depending on the type or kind and the process conditions of the substrate 110.

The driving circuit DC is disposed on buffer layer 120. The driving circuit DC includes a plurality of thin film transistors 10 and 20, and drives the organic light emitting element 70. For example, the organic light emitting element 70 emits light according to a driving signal provided by the driving circuit DC, and displays an image.

The organic light emitting element 70 emits light according to the driving signal provided by the driving circuit DC. Further, the organic light emitting element 70 includes a first electrode 710 that is an anode capable of injecting holes, a second electrode 730 that is a cathode capable of injecting electrons, and a light-emitting element layer 720 disposed between the first and second electrodes 710 and 730. For example, the first electrode 710, the light-emitting element layer 720, and the second electrode 730 are sequentially stacked to form the organic light emitting element 70. However, the present disclosure is not limited thereto. For example, the first electrode 710 may be a cathode electrode, and the second may be an anode electrode 730.

The first electrode 710 according to an exemplary embodiment of the present disclosure may be formed as a reflective layer and the second electrode 730 may be formed as a semi-transmissive layer or a transparent conductive layer. Accordingly, light generated from the light-emitting element layer 720 is emitted through the second electrode 730. For example, the organic light emitting diode display 101 according to an exemplary embodiment of the present disclosure has a front light-emitting type or kind of a cavity structure.

The reflective layer and the semi-transmissive layer are made of at least one metallic material selected from magnesium (Mg), silver (Ag), gold (Au), calcium (Ca), lithium (Li), chromium (Cr), aluminum (Al), and alloys thereof. Whether the layer is the reflective layer or the semi-transmissive layer is determined by the thickness thereof. In general, the semi-transmissive layer has a thickness that is less than about 200 nm (e.g., a thickness greater than 0 to less than about 200 nm). The thinner the semi-transmissive layer, the greater the transmittance of light through the semi-transmissive layer is, and the thicker the semi-transmissive layer, the less the transmittance of light through the semi-transmissive layer is.

The first electrode 710 may further include a transparent conductive layer. For example, the first electrode 710 may have a multi-layered structure including a reflective layer and a transparent conductive layer. The transparent conductive layer of the first electrode 710 is disposed between the reflective layer and the light-emitting element layer 720. The first electrode 710 may be formed to have a triple-layered structure in which a transparent conductive layer, a reflective layer, and a transparent conductive layer are sequentially stacked. For example, the first electrode 710 may be formed to have a structure in which indium-tin oxide (ITO), silver (Ag), and indium-tin oxide (ITO) are sequentially stacked.

The first electrode 710 may be formed by sputtering or vacuum deposition.

The transparent conductive layer is made of a material such as indium tin oxide (ITO), indium zinc oxide (IZO), indium zinc oxide (IZO), zinc oxide (ZnO), indium oxide ($In_2O_3$), and/or the like. The transparent conductive layer has a relatively high work function. Accordingly, when the first electrode 710 is formed to have the transparent conductive layer, holes are smoothly injected through the first electrode 710.

The light-emitting element layer 720 is formed as a multi-layer including one or more selected from a light emitting layer, a hole-injection layer (HIL), a hole-transporting layer (HTL), an electron-transporting layer (ETL), and an electron injection layer (EIL). Among the above-mentioned layers, the remaining layers other than the light emitting layer may be omitted if necessary or desired. When the light-emitting element layer 720 includes all of the above-mentioned layers, the hole-injection layer (HIL) is disposed on the first electrode 710 that is an anode electrode, and the hole-transporting layer (HTL), the light emitting layer, the electron-transporting layer (ETL), and the electron injection layer (EIL) are sequentially stacked on the hole-injection layer (HIL). The light-emitting element layer 720 may further include another layer if necessary or desired.

The pixel defining layer 190 includes an opening 1905. The opening 1905 of the pixel defining layer 190 partially exposes the first electrode 710. The first electrode 710, the light-emitting element layer 720, and the second electrode 730 are sequentially stacked in the opening 1905 of the pixel defining layer 190. In this case, the second electrode 730 is formed on not only the light-emitting element layer 720 but also on the pixel defining layer 190. Layers other than the light emitting layer among the light-emitting element layer 720 may be disposed between the pixel defining film 190 and the second electrode 730. The organic light emitting element 70 emits light in the light-emitting element layer 720 that is disposed within the opening 1905 of the pixel defining layer 190. For example, the opening 1905 of the pixel defining layer 190 defines a light emitting area.

The capping layer 500 is formed on the organic light emitting element 70. The capping layer 500 assists with effectively or suitably emitting light generated in the light-emitting element layer 720 to the outside while protecting the organic light emitting element 70.

In the present exemplary embodiment, the capping layer 500 includes an inorganic material having a refractive index which is equal to or greater than about 1.7 and equal to or less than about 6.0 (e.g., a refractive index of about 1.7 to about 6.0). In the present exemplary embodiment, an inorganic material forming the capping layer 500 includes at least one selected from copper iodide (CuI), thallium iodide (TlI), silver iodide (AgI), cadmium iodide ($CdI_2$), mercury iodide ($HgI_2$), stannum iodide ($SnI_2$), lead iodide ($PbI_2$), bismuth iodide ($BiI_3$), zinc iodide ($ZnI_2$), manganese iodide ($MnI_2$), iron iodide ($FeI_2$), cobalt iodide ($CoI_2$), nickel iodide ($NiI_2$), aluminium iodide ($AlI_3$), thorium (IV) iodide ($ThI_4$), and uranium triiodide ($UI_3$), which are transient metal-based iodides. Among the halogen materials, fluoride has low refractive characteristics, and iodide has high refractive characteristics. Accordingly, since the above-mentioned inorganic materials as transient metal-based iodides are a high refractive material, which is capable of thermal evaporation at a temperature of less than about 500 degrees Celsius, a thermal evaporation source for a thermal evaporation process is not necessarily a high temperature system, and thus costs may be reduced. Further, even when a thermal evaporation is performed under the same or substantially the same condition as in a vacuum, deposition may be implemented by a thermal evaporation method at a temperature of less than about 250 degrees Celsius. Since thermal evaporation may be performed at a relatively low temperature, resonance may strongly occur without change of electrical characteristics of the organic light emitting element 70. Accordingly, when the capping layer 500 is formed of the inorganic material of the transient metal-based iodides such the CuI or TlI, light efficiency may increase without change of electrical characteristics of the organic light emitting element 70. Further, since density of the CuI (5.67 g/cm3) and density of the TlI (7.29 g/cm3) are high, the capping layer may be immune to or substantially non-reactive toward oxygen and moisture. The thermal evaporation temperature of the oxide-based or nitride-based material, which are materials having a high refractive index, is relatively higher than that of an organic material.

The capping layer 500 is not limited to the above-mentioned exemplary embodiment, and it may include at least one selected from MgS, MgSe, MgTe, CaS, CaSe, CaTe, SrS, SrSe, SrTe, BaS, BaSe, BaTe, SnS, PbS, CdS, CaS, ZnS, ZnTe, PbTe, CdTe, SnSe, PbSe, CdSe, CuO, $Cu_2O$, $WO_3$, $MoO_3$, $SnO_2$, $Nb_2O_5$, $Ag_2O$, CdO, CoO, $Pr_2O_3$, $Bi_2O_3$, $Fe_2O_3$, AlAs, GaAs, InAs, GaP, InP, AlP, AlSb, GaSb, and InSb.

The encapsulation substrate 210 is disposed on the capping layer 500. The encapsulation substrate 210 is an insulating substrate made of glass, quartz, ceramic, plastic, or the like. The encapsulation substrate 210 and the substrate 110 are assembled and sealed together to cover the organic light emitting element 70. In this case, the encapsulation substrate 210 and the organic light emitting element 70 are spaced apart from each other. Further, a space between the encapsulation substrate 210 and the substrate 110 is sealed by a sealant.

In addition, an air layer 300 is disposed in a space between the encapsulation substrate 210 and the organic light emitting element 70. The air layer 300, in the present exemplary embodiment, may have a refractive index lower than that of the capping layer 500 corresponding to a high refraction layer.

An exemplary variation of the capping layer 500 will now be described with reference to FIG. 3.

Figure 3:
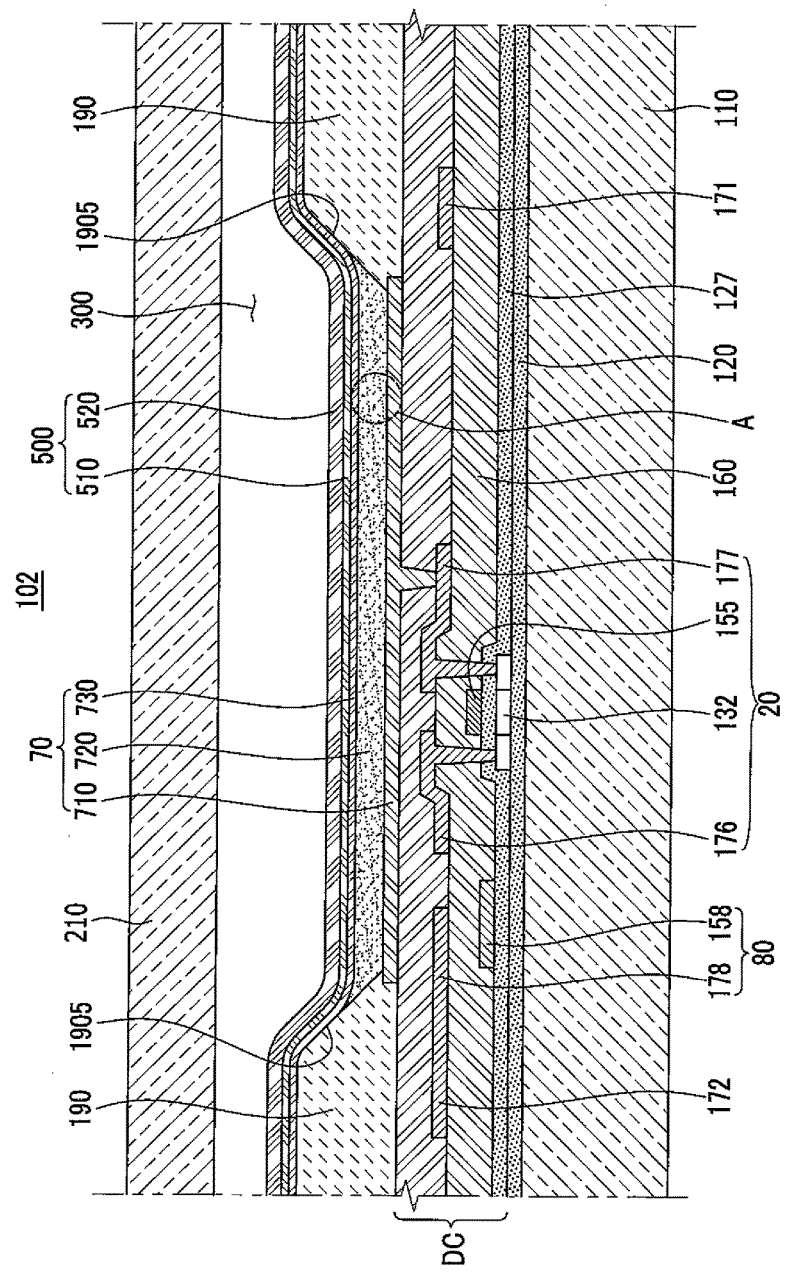
FIG. 3 is a cross-sectional view of an exemplary embodiment of the organic light emitting diode display of FIG. 2 including a variation of a capping layer.

FIG. 3 is a cross-sectional view of an exemplary embodiment having a variation of the capping layer of FIG. 2.

In the exemplary embodiment of FIG. 3, an organic light emitting diode 102 includes a capping layer 500 including a multi-layered layer having different refractive indexes. The capping layer 500 increases an extracting ratio of light emitted from the light-emitting element layer 720 of the organic light emitting element 70, thereby improving light efficiency.

For example, in FIG. 3 the capping layer 500 has a structure in which a low refraction layer 510 and a high refraction layer 520 are alternately stacked. Although one low refraction layer 510 and one high refraction layer 520 are shown in FIG. 3, the capping layer 500 is not limited thereto, and it may be formed of three or more layers, including one or more low refraction layer 510 and one or more high refraction layer 520. For example, the capping layer may include a plurality of refraction layer each including the low refraction layer and the high refraction layer.

In the present exemplary embodiment, the low refraction layer 510 may include an inorganic material having a refractive index which is equal to or greater than about 1.0 and equal to or less than about 1.7 (e.g., a refractive index of about 1.0 to about 1.7). An inorganic material used in the low refraction layer 510 may include a Group I element, a Group II element, a lanthanide, or a transition metal based halogen compound. In some embodiments, the low refraction layer 510 may include fluorine of a halogen compound. For example, the low refraction layer 510 may include at least one selected from $MgF_2$, LiF, $AlF_3$, NaF, KF, RbF, $CaF_2$, $SrF_2$, and $YbF_2$.

The high refraction layer 520 is disposed on the farthest top layer from the organic light emitting element 70. For example, the high refraction layer 520 is the farthest layer of the capping layer 500 from the organic light emitting element 70.

The high refraction layer 520 may include an inorganic material having a refractive index which is equal to or greater than about 1.7 and equal to or less than about 6.0 (e.g., a refractive index of about 1.7 to about 6.0).

An inorganic material used in the high refraction layer 520 may, for example, include at least one selected from CuI, thallium iodide (TlI), AgI, $CdI_2$, $HgI_2$, $SnI_2$, $PbI_2$, $BiI_3$, $ZnI_2$, $MnI_2$, $FeI_2$, $CoI_2$, $NiI_e$, aluminium iodide ($AlI_3$), thorium (IV) iodide ($ThI_4$), and uranium triiodide ($UI_3$). The high refraction layer 520 is not limited to the above-mentioned exemplary embodiment, and it may include at least one selected from MgS, MgSe, MgTe, CaS, CaSe, CaTe, SrS, SrSe, SrTe, BaS, BaSe, BaTe, SnS, PbS, CdS, CaS, ZnS, ZnTe, PbTe, CdTe, SnSe, PbSe, CdSe, CuO, $Cu_2O$, $WO_3$, $MoO_3$, $SnO_2$, $Nb_2O_5$, $Ag_2O$, CdO, CoO, $Pr_2O_3$, $Bi_2O_3$, $Fe_2O_3$, AlAs, GaAs, InAs, GaP, InP, AlP, AlSb, GaSb, and InSb.

In the present exemplary embodiment, the low refraction layer 510 has a thickness of about 100 angstroms to about 400 angstroms, and the high refraction layer 520 has a thickness of about 400 angstroms to about 800 angstroms. When the low refraction layer 510 and the high refraction layer 520 respectively have the above-mentioned thicknesses, efficiency of light which is emitted from the light-emitting element layer 720 and passes through the capping layer 500 may increase by at least 90%. However, the thickness of the capping layer 500 according to an exemplary embodiment of the present disclosure is not limited thereto. Accordingly, thickness of the low refraction layer 510 and the high refraction layer 520 may be appropriately or suitably adjusted, if necessary or desired.

Due to a refractive index difference between the low refraction layer 510 and high refraction layer 520 of the capping layer 500 one portion of light emitted from the light-emitting element layer 720 transmits through the capping layer 500, and the other portion thereof is reflected from (or reflected by) the capping layer 500. For example, light is reflected from an interface between the low refraction layer 510 and the high refraction layer 520, or an interface between the high refraction layer 520 and the air layer 300.

Light reflected from the capping layer 500 is again reflected from the first electrode 710 or the second electrode 730, and this process is repeated, thereby amplifying the light. Further, reflection of the light may be repeated inside the capping layer 500, thereby amplifying the light. For example, reflection of the light may be repeated between the interface between the low refraction layer 510 and the high refraction layer 520 and the interface between the high refraction layer 520 and the air layer 300.

The organic light emitting diode display 102 may effectively or suitably amplify light through such a resonance effect, thereby improving light efficiency.

In some embodiments, since the low refraction layer 510 and the high refraction layer 520 have different refractive indexes, light is reflected from the interface between the low refraction layer 510 and the high refraction layer 520 due to the refractive index between the low refraction layer 510 and the high refraction layer 520. The air layer 300, which directly contacts the high refraction layer 520, may be a low refractive material. In some embodiments, the air layer 300 has a refractive index of about 1.

Therefore, each of the low refraction layer 510 and the high refraction layer 520 has a refractive index of a set or predetermined range based on a refractive index of the air layer 300 and characteristics of a material that is used for manufacturing each of the refraction films 510 and 520. For example, the refractive index of the high refraction layer 520 may be equal to or greater than about 1.0 and equal to or less than about 6.0 (e.g., a refractive index of about 1.0 to about 6.0) depending on the component of the high refraction layer 520. The refractive index of the low refraction layer 510 may be equal to or greater than about 1.0 and less than about 1.7 (e.g., a refractive index of about 1.0 to about 1.7) depending on the component of the low refraction layer 510. In this case, even if the low refraction layer 510 and the high refraction layer 520 are formed of the same or substantially the same material, their refractive indexes may be different from each other depending on a manufacturing method thereof.

The features and contents described with respect to FIG. 2, as well as the above-described difference, may be applied to the exemplary embodiment of FIG. 3.

As described with respect to an exemplary embodiment of the present disclosure, compared to the capping layer 500 formed of an inorganic material, table 1 represents changes of light efficiency of the capping layer 500 formed of an organic material.

TABLE 1

|  | Single organic layer | Double organic layer | Organic/ Inorganic double layer | Single inorganic layer | Single inorganic layer | Double inorganic layer | Double inorganic layer |
| --- | --- | --- | --- | --- | --- | --- | --- |
| Upper layer | Organic material 1 | Organic material 2 | Organic material 2 | CuI | TlI | CuI | TlI |
| Lower layer | — | Balq | AlF3 | — | — | AlF3 | AlF3 |
| Relative efficiency | 1.0 | 1.06 | 1.08 | 1.10 | 1.17 | 1.13 | 1.13 |

Referring to Table 1, when light efficiency is set at about 1.0 in the case where the capping layer 500 is formed as a single organic layer with organic material 1 and the light efficiency is set at about 1.06 in the case where the capping layer 500 is formed as a double organic layer with an organic material 2 and Balq, a relative light efficiency of the capping layer 500 formed of a measured CuI is improved by about 10%, and when a lower layer of the capping layer is formed of $AlF_3$ and an upper layer of the capping layer is formed of CuI, a relative light efficiency of the capping layer is improved by about 13%. In this case, the organic material 1 and the organic material 2 may have a refractive index of about 1.88 to about 1.90, and they may be any suitable organic material available for use in a manufactured capping layer with the refractive index.

Structures of the driving circuit DC and the organic light emitting element 70 will now be described in more detail.

Referring to FIGS. 1 and 2, although an active matrix (AM) type or kind of organic light emitting diode display 101 having a 2Tr-1Cap structure where a pixel is provided with two thin film transistors (TFTs) 10 and 20 and one capacitor 80 is illustrated, the present disclosure is not limited thereto. Accordingly, the organic light emitting diode display 101 may be provided with three or more thin film transistors and two or more storage capacitors in one pixel, and may be configured to have various suitable structures having additional wires. Herein, a pixel represents a base or minimum unit displaying an image and the organic light emitting diode display 101 displays images by using a plurality of pixels.

A switching thin film transistor 10, a driving thin film transistor 20, a capacitor 80, and an organic light emitting diode (OLED) 70 are formed in each pixel. Here, a configuration including the switching thin film transistor 10, the driving thin film transistor 20, and the capacitor 80 is referred to as a driving circuit DC. In addition, gate lines 151 disposed in one direction, data lines 171 crossing the gate lines 151, and common power lines 172 are formed. Although each pixel may be defined by taking the gate lines 151, the data line 171, and the common power line 172 as a boundary, the present disclosure is not limited thereto.

The organic light emitting element 70 includes a first electrode 710, a light-emitting element layer 720 disposed on the first electrode 710, and a second electrode 730 formed on the light-emitting element layer 720. Holes and electrodes from the first electrode 710 and the second electrode 730 are injected into the light-emitting element layer 720. Light is emitted when excitons in which the injected holes and electrons are combined drop from an excited state to a ground state.

The capacitor 80 includes a pair of capacitor plates 158 and 178 disposed with an interlayer insulating layer 160 interposed therebetween. Here, the interlayer insulating layer 160 becomes (or includes) a dielectric material. The capacitance of the capacitor 80 is determined depending upon the charges charged in the capacitor 80, and the voltages of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. A gate insulating layer 127 may be disposed between the driving semiconductor layer 132 and the driving gate electrode 155.

The switching thin film transistor 10 is used as a switch to select a pixel to emit light. The switching gate electrode 152 is coupled or connected to the gate line 151. The switching source electrode 173 is coupled or connected to the data line 171. The switching drain electrode 174 is spaced apart from the switching source electrode 173 and is coupled or connected to one (158 in this case) of the capacitor plates 158 and 178. The switching drain electrode 174 is disposed to be spaced apart from the switching source electrode 173 and is coupled or connected to the capacitive plate 158.

The driving thin film transistor 20 applies driving power to the pixel electrode 710 for light emission of the light-emitting element layer 720 of the organic light emitting element 70 in the selected pixel. The driving gate electrode 155 is coupled or connected to the capacitor plate 158 that is coupled or connected to the switching drain electrode 174. The driving source electrode 176 and the capacitor plate 178 are respectively coupled or connected to the common power lines 172. The driving drain electrode 177 is coupled or connected to the pixel electrode 710 of the organic light emitting element 70 through a contact hole.

With such a structure, the switching thin film transistor 10 is driven by a gate voltage applied to the gate line 151 to transmit a data voltage applied to the data line 171 to the driving thin film transistor 20. A voltage corresponding to a voltage difference between the common voltage applied to the driving thin film transistor 20 from the common power line 172 and the data voltage transmitted from the switching thin film transistor 10 is stored in the capacitor 80, and a current corresponding to the voltage stored in the capacitor 80 flows to the organic light emitting element 70 through the driving thin film transistor 20 such that the organic light emitting element 70 emits light.

Hereinafter, an organic light emitting element 70 according to an exemplary embodiment of the present disclosure will be described with reference to FIG. 4.

Figure 4:
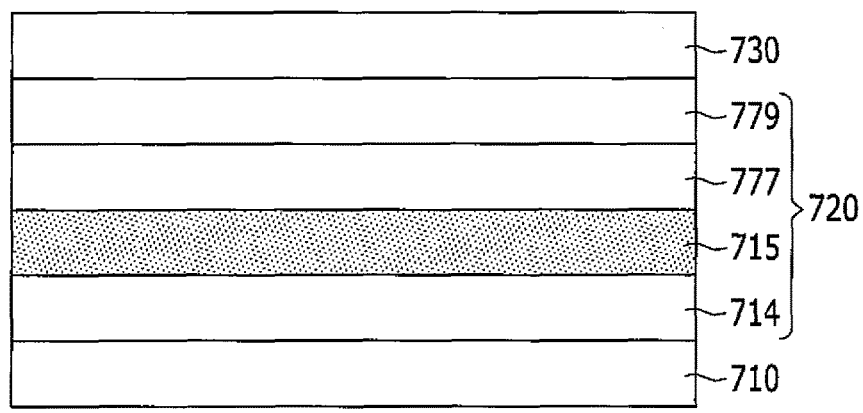
FIG. 4 is an enlarged cross-sectional view of the circled area A of the organic light emitting element of FIG. 2.

FIG. 4 is an enlarged cross-sectional view of the circled area A of the organic light emitting element of FIG. 2.

Referring to FIGS. 2 and 4, the organic light emitting element (portion "A" of FIG. 2) according to an exemplary embodiment of the present disclosure includes a structure in which the first electrode 710, a hole transport layer 714, a light emitting layer 715, an electron-transporting layer 777, an electron injection layer 779, and the second electrode 730 are sequentially stacked.

In the organic light emitting element 70 according to the present exemplary embodiment, the first electrode 710, as described above, is formed as a reflective layer so as to have a front light-emitting type or kind of structure, and the second electrode 730 corresponding to the common electrode may be formed as a semi-transmissive layer.

The hole transport layer 714 is formed on the first electrode 710. The hole transport layer 714 may transport holes transmitted from a hole-injection layer formed between the first electrode 710 and the hole transport layer 714. The hole transport layer 714 may include an organic material. For example, the hole transport layer 714 may include NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4"-Tris (N-3-methylphenyl-N-phenyl-amino)-triphenylamine), but the hole transport layer is not limited thereto.

The hole transport layer 714 may be about 15 nm to about 25 nm thick. For example, the hole transport layer 714 may be about 20 nm thick. The hole transfer/injection layers may be formed to be a single layer by transforming the above-described hole transport layer 714 and including a hole injecting material in the hole transport layer 714.

The light emitting layer 715 is disposed on the hole transport layer 714. The light emitting layer 715 includes a light emitting material for expressing a set or specific color. For example, the light emitting layer 715 may express basic colors, such as blue, green, or red, or combinations or mixtures thereof.

The light emitting layer 715 may be about 10 nm to about 50 nm thick. The light emitting layer 715 includes a host and a dopant. The light emitting layer 715 may include a material emitting red, green, blue, and white light, and may be made of a phosphorescent or fluorescent material.

The light emitting layer 715 emits red light, it may be made of a phosphorescent material including a host material, which includes CBP (carbazole biphenyl) or mCP (1,3-bis (carbazol-9-yl), and a dopant, which includes any one or more selected from a group of PIQIr(acac) (bis (1-phenylisoquinoline)acetylacetonate iridium), PQIr(acac) (bis (1-phenylquinoline)acetylacetonate iridium), PQIr(tris (1-phenylquinoline)iridium) and PtOEP(octaethylporphyrin platinum), or it may be made of a fluorescent material including PBD:Eu(DBM)3(Phen) or Perylene, but the light emitting layer is not limited thereto.

When the light emitting layer 715 emits green light, it may be made of a phosphorescent material including a host material, which includes CBP or mCP, and a dopant material, which includes, Ir(ppy)3(fac-tris (2-phenylpyridine) iridium), or it may be made of a fluorescent material including Alq3(tris (8-hydroxyquinolino)aluminum), but the light emitting layer is not limited thereto.

When the light emitting layer 715 emits blue light, it may be made of a phosphorescent material including a host material, which includes CBP or mCP, and a dopant material, which includes (4,6-F2ppy)2Irpic. In some embodiments, the light emitting layer may be made of a fluorescent material including at least one selected from spiro-DPVBi, spiro-6P, distyryl benzene (DSB), distyrylarylene (DSA), PFO-based polymer, and PPV-based polymer, but the fluorescent material is not limited thereto.

The electron-transporting layer 777 is disposed on the light emitting layer 715. The electron-transporting layer 777 may transmit the electron to the light emitting layer 715 from the second electrode 730. The electron-transporting layer 777 may prevent the holes injected by the first electrode 710 from moving to the second electrode 730 through the light emitting layer 715 (or may reduce such movement of the holes). For example, the electron-transporting layer 777 functions as a hole blocking layer to help the holes and the electrons bond in the light emitting layer 715.

The electron-transporting layer 777 may include an organic material. For example, the electron-transporting layer 777 may be made of any one or more selected from a group of Alq3 (tris (8-hydroxyquinolino) aluminum), PBD, TAZ, spiro-PBD, BAlq and SAlq, but the electron-transporting layer is not limited thereto.

The electron injection layer 779 is disposed on the electron-transporting layer 777. The electron injection layer 779 functions to improve the injection of electrons to the electron-transporting layer 777 from the second electrode 730. The electron injection layer 779 according to the present exemplary embodiment includes a dipole material and a first metal. Here, the dipole material and the first metal are co-deposited to form one layer. The first metal may include at least one selected from Yb, Mg, Li, Na, Ca, Sr, Ba, In, Sn, La, Ce, Pr, Nd, Pm, Eu, Gd, Tb, Dy, Ho, Er, Sm, and Lu.

The dipole material consists of a first component and a second component of different polarities, which are coupled to each other, and the first component may include one selected from an alkali metal, an alkali earth metal, a rare-earth metal, and a transition metal, and the second component may include a halogen. For example, the first component may be an element including at least one selected from Li, Na, K, Rb, Cs, Be, Mg, Ca, Sr, and Ba, and the second component may be an element including at least one selected from F, Cl, Br, and I. Here, the first component is an element that becomes a cation when the dipole material is ionized, and the second component may be an element that becomes an anion.

In the present exemplary embodiment, the thickness of the electron injection layer 779 has a low or minimum value of about 5 angstroms (Å) by considering a process margin and a high or maximum value of about 50 angstroms (Å) by considering the difficulty as a function of the electron injection layer, and thereby a range thereof may be about 5 angstroms (Å) to about 50 angstroms (Å). In some embodiments, however, the thickness of the electron injection layer may be about 10 angstroms (Å) to about 20 angstroms (Å).

The second electrode 730 is disposed on the electron injection layer 779. The thickness of the second electrode 730 may be about 30 angstroms (Å) to about 300 angstroms (Å). In the present exemplary embodiment, the second electrode 180 is deposited by sputtering.

Figure 5:
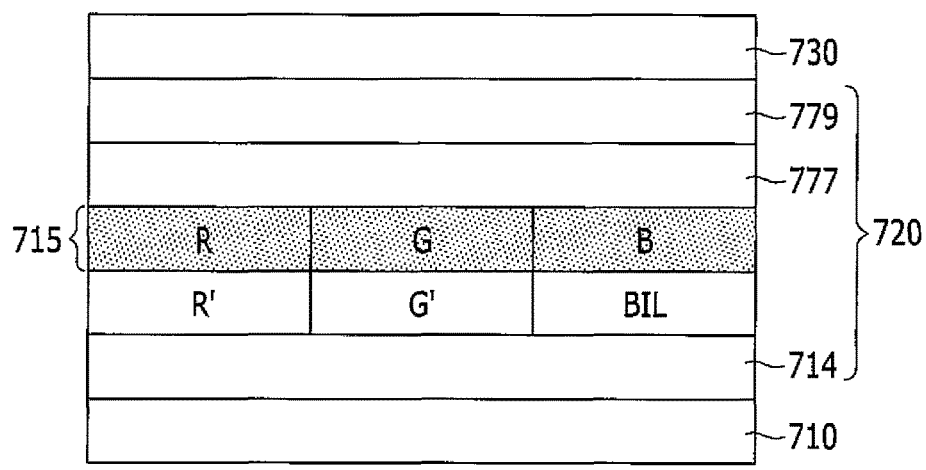
FIG. 5 is a cross-sectional view of a partially modified organic light emitting element of FIG. 4.

FIG. 5 is a cross-sectional view of a partially modified organic light emitting element of FIG. 4.

FIG. 5 illustrates an example variation of the light emitting layer 715 of the organic light emitting element described with reference to FIG. 4. For example, in the present exemplary embodiment, the light emitting layer 715 may include a red light emitting layer (R), a green light emitting layer (G), and a blue light emitting layer (B), and an auxiliary layer (BIL) may be disposed below the blue light emitting layer (B) so that efficiency of the blue light emitting layer (B) may be improved.

The red light emitting layer (R) may be about 30 nm to about 50 nm thick, the green light emitting layer (G) may be about 10 nm to about 30 nm thick, and the blue light emitting layer (B) may be about 10 nm to about 30 nm thick. The auxiliary layer (BIL) disposed below the blue light emitting layer (B) may be equal to or less than about 20 nm thick (e.g., the auxiliary layer (BIL) may have a thickness of greater than 0 nm to about 20 nm). The auxiliary layer (BIL) may improve the efficiency of the blue light emitting layer (B) by adjusting hole charge balance. The auxiliary layer (BIL) may include a compound represented by Chemical Formula 1.

Chemical Formula 1

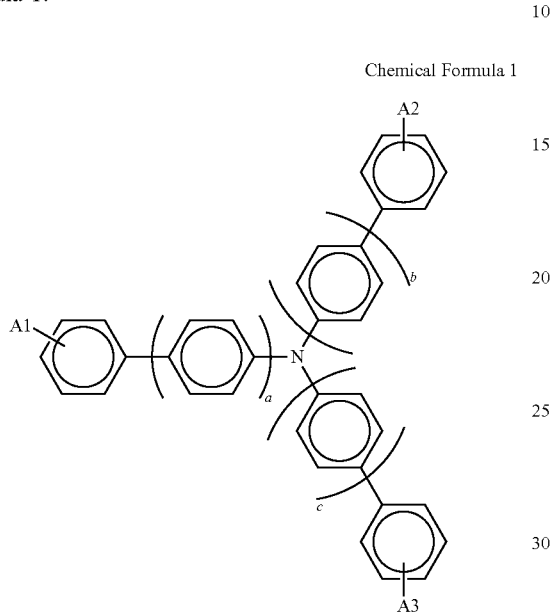

In Chemical Formula 1, A1, A2, and A3 are each independently selected from an alkyl group, an aryl group, carbazole, dibenzothiophene, dibenzofuran (DBF), and biphenyl, and a, b, and c are each positive numbers of zero to four.

As an example of the compounds represented by Chemical Formula 1, the following Chemical Formulas 1-1, 1-2, 1-3, 1-4, 1-5, and 1-6 may be included.

Chemical Formula 1-1

Chemical Formla 1-2

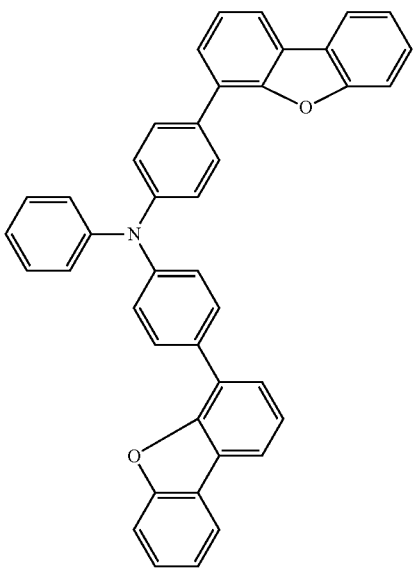

Chemical Formula 1-3

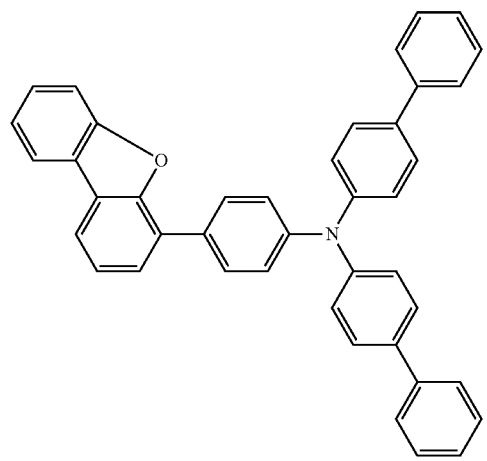

Chemical Formula 1-4

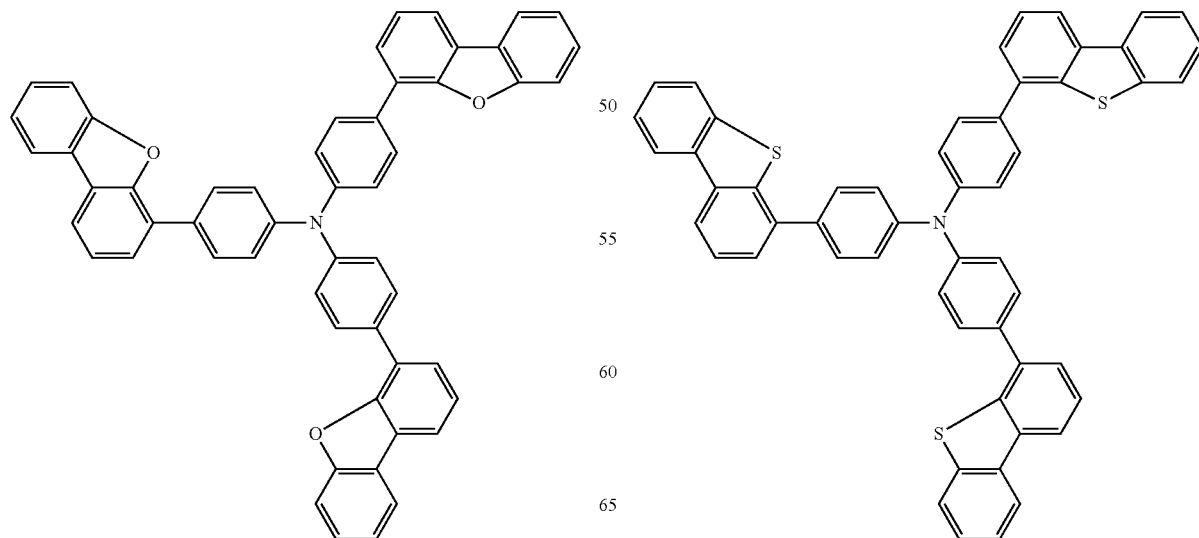

Chemical Formula 1-5

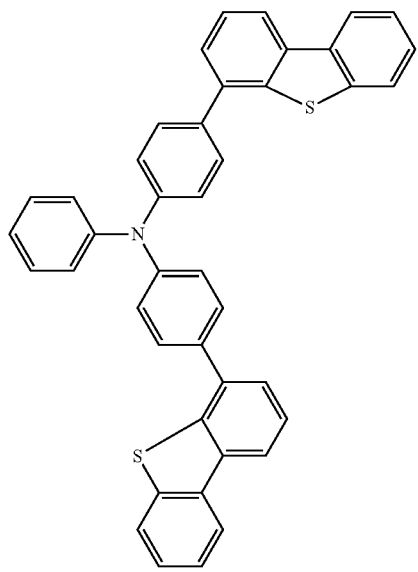

Chemical Formula 1-6

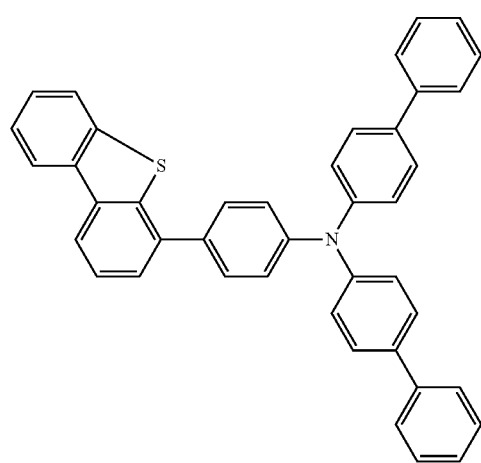

In an exemplary embodiment, the auxiliary layer (BIL) may include a compound represented by Chemical Formula 2.

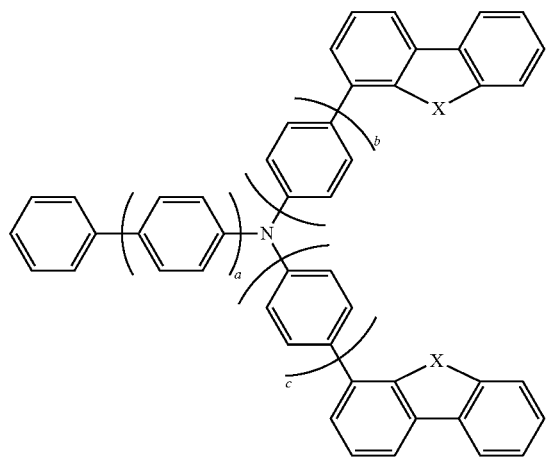

Chemical Formula 2

In Chemical Formula 2, a may be 0 to 3, b and c may respectively be 0 to 3, X may be selected from O, N, or S, and each X may be the same as the other or different.

As an example of the compound represented by Chemical Formula 2, Chemical Formulas 2-1, 2-2, 2-3, 2-4, 2-5, and 2-6 may be included.

Chemical Formula 2-1

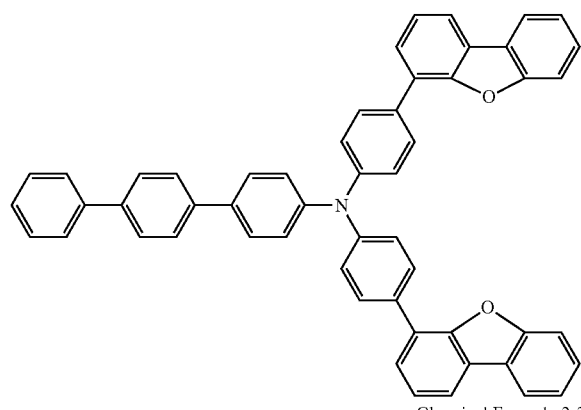

Chemical Formula 2-2

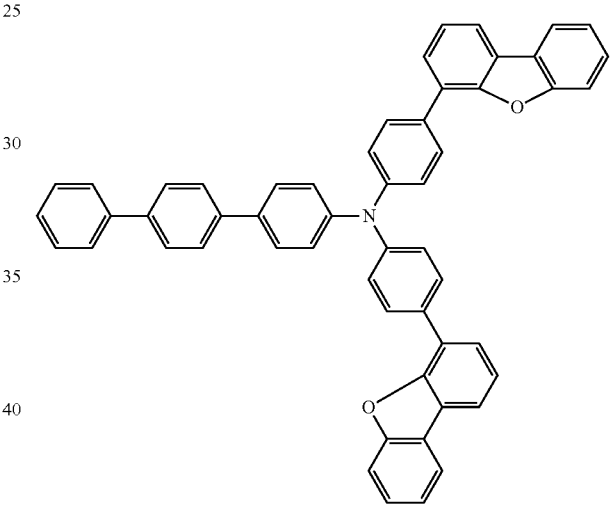

Chemical Formula 2-3

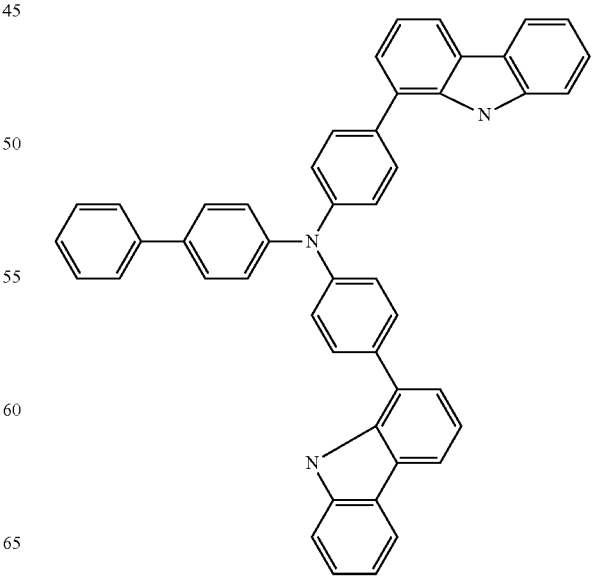

Chemical Formula 2-4

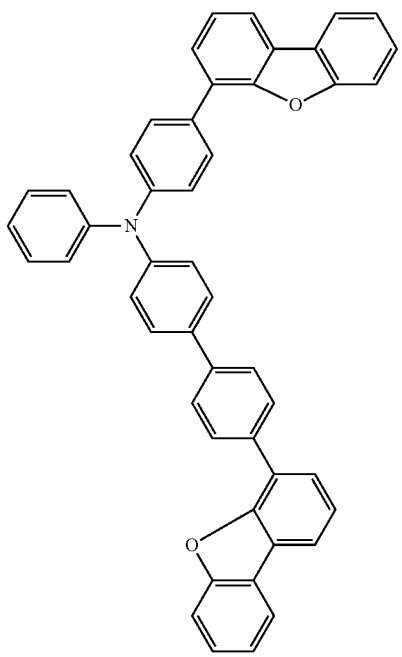

Chemical Formula 2-6

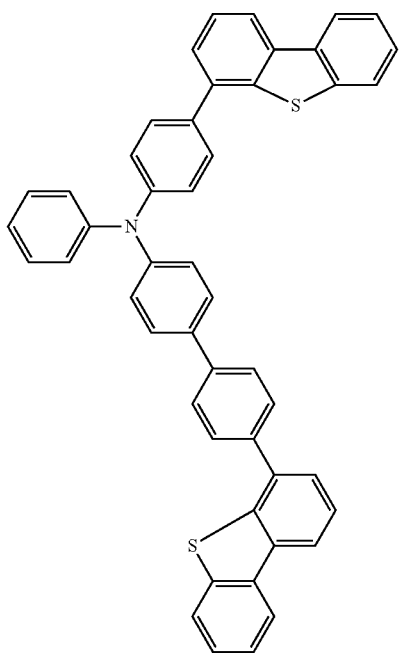

Chemical Formula 2-5

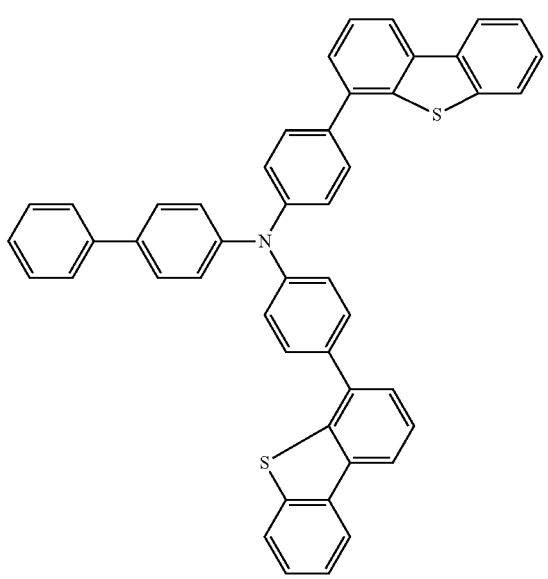

In an exemplary embodiment, the auxiliary layer (BIL) may include a compound represented by Chemical Formula 3.

Chemical Formula 3

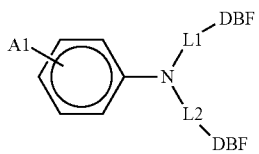

In Chemical Formula 3, A1 may be an alkyl group, an aryl group, carbazole, dibenzothiophene, or dibenzofuran (DBF), L1 and L2 may be

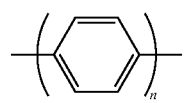

(wherein n is 0 to 3), and DBF coupled or connected to L1 and L2 may be replaced by carbazole or dibenzothiophene.

Hereinafter, a composition method (e.g., synthesis or manufacture) of the auxiliary layer (BIL) according to an exemplary embodiment of the present disclosure will be described. For example, the composition method of the following Chemical formula 1-1 will be described.

Chemical Formula 1-1

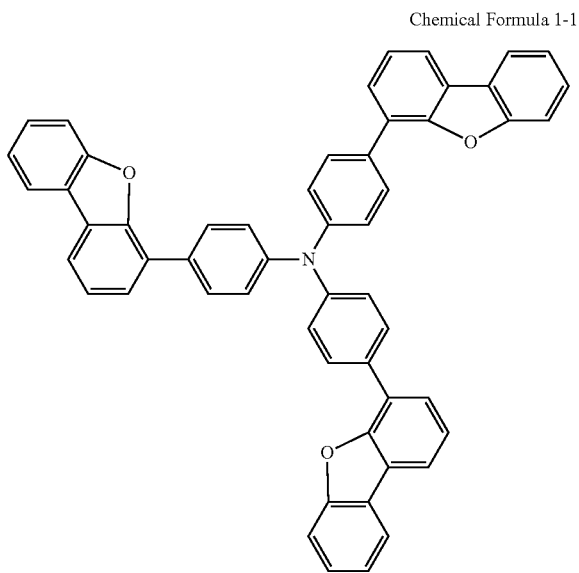

COMPOSITION EXAMPLE

Under an argon atmosphere, 6.3 g of 4-dibenzofuran boronic acid, 4.8 mg of 4,4',4''-tribromotriphenylamine, 104 mg of tetrakis(triphenylphosphine)palladium ($Pd(PPh_3)_4$), 48 ml of a sodium carbonate ($Na_2CO_3$) solution (2 M), and 48 ml of toluene were put in a 300 ml 3-neck flask, and reacted at 80° C. for eight hours. The reaction solution was extracted with toluene/water, and dried with anhydrous sodium sulfate. The resultant was condensed under low pressure, and 3.9 g of a yellowish-white powder was obtained through column purification of the obtained crude product.

In FIG. 5, a red resonant auxiliary layer (R') may be disposed below the red light emitting layer (R), and a green resonant auxiliary layer (G') may be disposed below the green light emitting layer (G). The red resonant auxiliary layer (R') and the green resonant auxiliary layer (G') are layers that can adjust a resonant distance for the respective color. In some embodiments, a resonant auxiliary layer may not be separately formed below the blue light emitting layer (B) corresponding to the red light emitting layer (R) or the green light emitting layer (G) and below the auxiliary layer (BIL) so that the resonant auxiliary layer is interposed between the blue light emitting layer (B) and the auxiliary layer (BIL) and the hole transport layer 714.

The features and contents described with respect to FIGS. 1 to 4, as well as the above-described difference, may be applied to an exemplary embodiment of FIG. 5.

Figure 6:
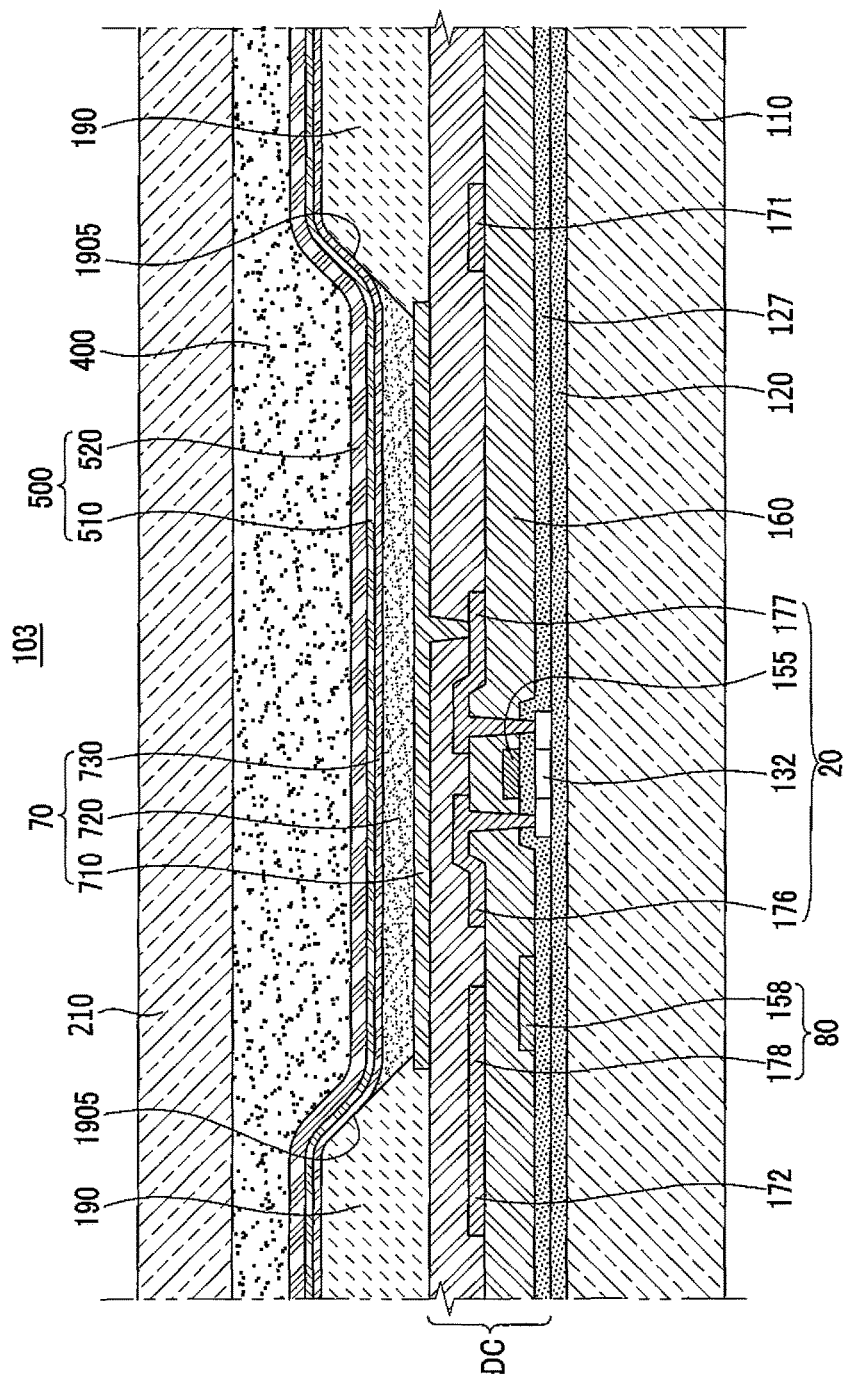
FIG. 6 is a cross-sectional view of an exemplary embodiment of the organic light emitting diode display of FIG. 3 in which an air layer is replaced with a filler.

FIG. 6 is a cross-sectional view of an exemplary embodiment in which the air layer of FIG. 3 is replaced with a filler.

As shown in FIG. 6, an organic light emitting diode display 103 according to an exemplary embodiment of the present disclosure includes a filler 400 disposed in a space between the organic light emitting element 70 and the encapsulation substrate 210. The filler 400 fills the inside of the organic light emitting diode display 103 instead of the air layer 300 described with respect to FIG. 3.

The filler 400 is made of an organic material, e.g., a polymer having a refractive index of about 1.7 or less. For example, the filler 400 has a refractive index that is lower than the high refraction film 520 of the capping layer 500.

Through such a configuration, the organic light emitting diode display 103 according to the exemplary embodiment of the present disclosure can improve light efficiency through the capping layer 500.

Further, since the filler 400 fills an empty space of the organic light emitting diode display 103, mechanical strength and durability of the organic light emitting diode display 103 may be improved.

As used herein, expressions such as "at least one selected from," when preceding a list of elements, modify the entire list of elements and do not modify the individual elements of the list. Further, the use of "may" when describing embodiments of the present invention refers to "one or more embodiments of the present disclosure."

It will be understood that, although the terms "first," "second," "third," etc., may be used herein to describe various elements, components, regions, layers and/or sections (e.g., a first electrode and a second electrode), these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," and similar terms are used as terms of approximation and not as terms of degree, and are intended to account for the inherent deviations in measured or calculated values that would be recognized by those of ordinary skill in the art. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

| Description of some of the symbols | | | |
|---|---|---|---|
| 70 | organic light emitting element | 210 | encapsulation substrate |
| 500 | capping layer | 510 | low refraction layer |
| 520 | high refraction layer | BIL | auxiliary layer |

What is claimed is:

1. An organic light emitting diode display comprising:
a substrate;
an organic light emitting element on the substrate; and
a capping layer on the organic light emitting element and comprising a high refraction layer comprising an inorganic material having a refractive index which is equal to or greater than about 1.7 and equal to or less than about 6.0,
wherein the inorganic material comprises at least one selected from CuI, thallium iodide (TlI), AgI, $CdI_2$, $HgI_2$, $SnI_2$, $PbI_2$, $BiI_3$, $ZnI_2$, $MnI_2$, $FeI_2$, $CoI_2$, $NiI_2$, aluminium iodide ($AlI_3$), thorium (IV) iodide ($ThI_4$), uranium triiodide ($UI_3$), MgS, MgSe, MgTe, CaS, CaSe, CaTe, SrS, SrSe, SrTe, BaS, BaSe, BaTe, SnS, CdS, CaS, ZnTe, CdTe, SnSe, CdSe, CuO, $Cu_2O$, $Ag_2O$, CdO, CoO, $Pr_2O_3$, $Bi_2O_3$, $Fe_2O_3$, AlAs, GaAs, InAs, GaP, InP, AlP, AlSb, GaSb, and InSb,
wherein the capping layer further comprises a low refraction layer formed of an inorganic material having a refractive index which is equal to or greater than about 1.0 and equal to or less than about 1.7, and
wherein the capping layer comprises a plurality of refraction layers each comprising the low refraction layer and the high refraction layer.

2. The organic light emitting diode display of claim 1, wherein:
the low refraction layer is between the high refraction layer and the organic light emitting element.

3. The organic light emitting diode display of claim 2, wherein:
the low refraction layer comprises an inorganic material comprising a halogen compound.

4. The organic light emitting diode display of claim 3, wherein:
the low refraction layer comprises at least one selected from $MgF_2$, LiF, $AlF_3$, NaF, KF, RbF, $CaF_2$, $SrF_2$, and $YbF_2$.

5. The organic light emitting diode display of claim 1, further comprising:
an encapsulation substrate on and sealing the substrate to cover the organic light emitting element.

6. The organic light emitting diode display of claim 5, wherein:
the encapsulation substrate and the organic light emitting element are spaced apart from each other.

7. The organic light emitting diode display of claim 1, wherein:
the organic light emitting element comprises:
a first electrode and a second electrode facing each other, and
a light emitting layer between the first electrode and the second electrode,
wherein the capping layer is directly on the second electrode.

8. The organic light emitting diode display of claim 7, wherein:
the first electrode comprises a reflective layer.

9. The organic light emitting diode display of claim 8, wherein:
the light emitting layer comprises a red light emitting layer, a green light emitting layer, a blue light emitting layer, and
an auxiliary layer below the blue light emitting layer.

10. The organic light emitting diode display of claim 9, further comprising:
a red resonant auxiliary layer below the red light emitting layer and a green resonant auxiliary layer below the green light emitting layer.

11. The organic light emitting diode display of claim 9, wherein:
the auxiliary layer comprises a compound represented by Chemical Formula 1:

Chemical Formula 1

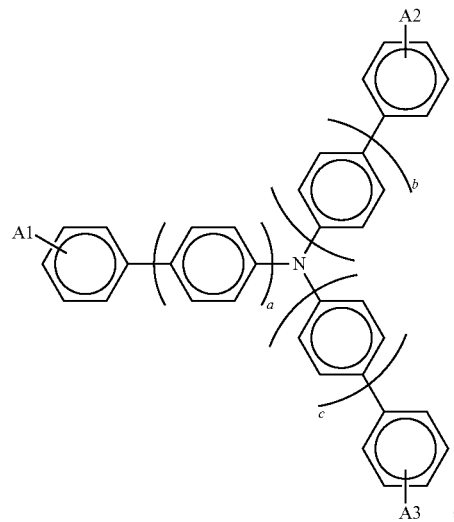

wherein, in Chemical Formula 1, A1, A2, and A3 are each independently selected from an alkyl group, an aryl group, carbazole, dibenzothiophene, dibenzofuran (DBF), and biphenyl, and a, b, and c are each positive numbers of zero to four.

12. The organic light emitting diode display of claim 9, wherein:
the auxiliary layer comprises a compound represented by Chemical Formula 2:

Chemical Formula 2
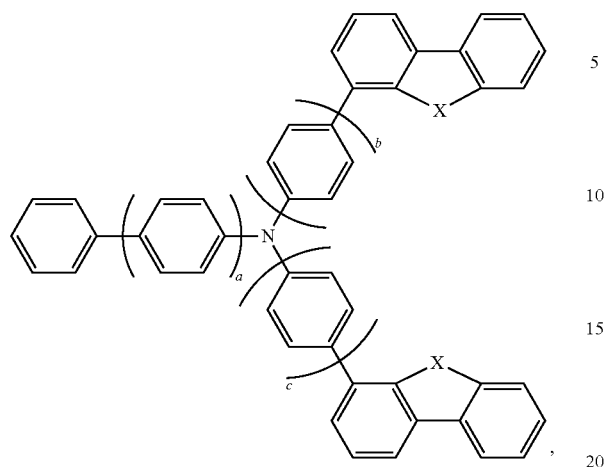
wherein, in Chemical Formula 2, a may be 0 to 3, b and c may be 0 to 3, X may be selected from O, N, or S, and each X may be the same as the other or different.
* * * * *